United States Patent
Maeda

(10) Patent No.: US 11,138,487 B2
(45) Date of Patent: Oct. 5, 2021

(54) METHOD FOR MANUFACTURING RFID INLET AND ANTENNA PATTERN

(71) Applicant: SATO HOLDINGS KABUSHIKI KAISHA, Tokyo (JP)

(72) Inventor: Yoshimitsu Maeda, Saitama (JP)

(73) Assignee: SATO HOLDINGS KABUSHIKI KAISHA, Tokyo (JP)

( * ) Notice: Subject to any disclaimer, the term of this patent is extended or adjusted under 35 U.S.C. 154(b) by 277 days.

(21) Appl. No.: 16/085,711

(22) PCT Filed: Feb. 20, 2017

(86) PCT No.: PCT/JP2017/006128
§ 371 (c)(1),
(2) Date: Sep. 17, 2018

(87) PCT Pub. No.: WO2017/159222
PCT Pub. Date: Sep. 21, 2017

(65) Prior Publication Data
US 2020/0302261 A1 Sep. 24, 2020

(30) Foreign Application Priority Data
Mar. 18, 2016 (JP) .............................. JP2016-056201

(51) Int. Cl.
*G06K 19/077* (2006.01)
*G06K 19/07* (2006.01)
*H01L 23/66* (2006.01)
*H01Q 1/38* (2006.01)

(52) U.S. Cl.
CPC ... *G06K 19/07718* (2013.01); *G06K 19/0723* (2013.01); *H01L 23/66* (2013.01); *H01Q 1/38* (2013.01); *H01L 2223/6677* (2013.01)

(58) Field of Classification Search
CPC .......... G06K 19/07718; G06K 19/0723; H01L 23/66; H01L 2223/6677; H01Q 1/38
See application file for complete search history.

(56) References Cited

U.S. PATENT DOCUMENTS

| 7,159,298 B2* | 1/2007 | Lieberman | ....... G06K 19/07718 29/601 |
| 8,163,120 B2* | 4/2012 | Higasa | .................... C09J 175/04 156/250 |
| 8,511,566 B2* | 8/2013 | Komiyama | .......... G06K 19/022 235/488 |

(Continued)

FOREIGN PATENT DOCUMENTS

| JP | 2005-340773 A | 12/2005 |
| JP | 2006-146786 A | 6/2006 |

(Continued)

*Primary Examiner* — Peter Dungba Vo
*Assistant Examiner* — Jeffrey T Carley
(74) *Attorney, Agent, or Firm* — Foley & Lardner LLP

(57) ABSTRACT

A method for manufacturing antenna pattern according to an embodiment includes an adhesive arranging step, a metal sheet arranging step, a cutting step, a removing step, and a pressurizing step. In the adhesive arranging step, an adhesive is arranged inside with respect to a perimeter line of the antenna pattern arranged on a continuous body while conveying the continuous body of a base material.

5 Claims, 3 Drawing Sheets

(56) References Cited

U.S. PATENT DOCUMENTS

| | | | |
|---|---|---|---|
| 2002/0003397 A1* | 1/2002 | Yamazaki | H01L 51/0004 313/483 |
| 2002/0018880 A1* | 2/2002 | Young | B32B 7/06 428/209 |
| 2003/0136503 A1* | 7/2003 | Green | G06K 19/07758 156/264 |
| 2004/0168924 A1* | 9/2004 | Bohn | G06K 19/077 205/76 |
| 2005/0183264 A1* | 8/2005 | Eckstein | H01Q 1/38 29/834 |
| 2006/0244603 A1* | 11/2006 | Kline | G06K 19/07752 340/572.7 |
| 2008/0084274 A1 | 4/2008 | Ohashi et al. | |
| 2009/0038735 A1* | 2/2009 | Kian | G06K 19/07718 156/73.1 |

FOREIGN PATENT DOCUMENTS

| | | | | |
|---|---|---|---|---|
| JP | 2007108983 A | * | 4/2007 | H01L 24/95 |
| JP | 2007-536606 A | | 12/2007 | |
| JP | 2008084160 A | * | 4/2008 | |
| JP | 2009-157428 A | | 7/2009 | |
| JP | 2012-194743 A | | 10/2012 | |

* cited by examiner

METHOD FOR MANUFACTURING RFID INLET AND ANTENNA PATTERN

TECHNICAL FIELD

The present invention relates to a method for manufacturing antenna pattern in an RFID inlet, a method for manufacturing RFID inlet, a method for manufacturing RFID label, and a method for manufacturing RFID medium.

BACKGROUND ART

In fields such as a production, a management, and a distribution of products, a tag on which information on the product is printed to ensure visual confirmation and attached to the product and a label on which information on the product is printed to ensure visual confirmation and stuck to the product and the like have been employed. Nowadays, a Radio Frequency Identification (RFID) technique, which transmits/receives information to/from an IC chip in which identification information has been written by contactless communication, has been applied to various kinds of fields and has been prevailing in these fields as well.

On the tag, the label, a wristband, and the like (hereinafter referred to as an RFID medium) into which the IC chip and an antenna pattern with such RFID specification are incorporated, information on an object to which the RFID medium is attached, an object to which the RFID medium is stuck, or a person who wears the RFID medium (hereinafter, these objects and person are correctively referred to as an adhered body) is printed to ensure visual confirmation, and the incorporated IC chip can store various pieces of information on the adhered body.

Conventionally, as one example of a method to form the antenna patterns in a manufacturing process of the RFID inlets, a method that prints a resist layer of an antenna pattern on a metal foil laminated on a base material and melts and remove a part other than the antenna pattern by chemical etching is employed (see JP2012-194743A).

SUMMARY OF INVENTION

The method for forming the antenna pattern by the etching described in JP2012-194743A has required a facility to print the resist layer and a facility for the chemical etching. Further, the method has required a step of removing the resist layer.

Thus, the manufacturing facility and the manufacturing step for the etching method involve an increase in the production cost. Since it is difficult to improve the production efficiency by the etching method, an additional improvement has been required for the manufacturing process of the antenna pattern.

Therefore, an object of the present invention is to eliminate the need for the etching method and ensure manufacturing antenna patterns with good productivity.

According to one aspect of the present invention, there is provided a method for manufacturing antenna pattern in an RFID inlet that includes a base material, an antenna pattern disposed at one surface of the base material, and an IC chip coupled to the antenna pattern. The method includes: an adhesive arranging step of arranging an adhesive inside with respect to a perimeter line of the antenna pattern arranged on a continuous body of the base material while conveying the continuous body of the base material; a metal sheet arranging step of arranging a continuous body of a metal sheet on a surface on which the adhesive is arranged of the continuous body of the base material, the continuous body of the metal sheet constituting the antenna pattern; a cutting step of forming a shape cutting of the antenna pattern into the continuous body of the metal sheet; a removing step of removing an unnecessary part not constituting the antenna pattern in the continuous body of the metal sheet; and a pressurizing step of pressurizing the antenna pattern arranged on the continuous body of the base material.

According to another aspect of the present invention, there is provided a method for manufacturing RFID inlet that includes a base material, an antenna pattern disposed at one surface of the base material, and an IC chip coupled to the antenna pattern. The method includes: an adhesive arranging step of arranging an adhesive inside with respect to a perimeter line of the antenna pattern arranged on a continuous body of the base material while conveying the continuous body of the base material; a metal sheet arranging step of arranging a continuous body of a metal sheet on a surface on which the adhesive is arranged of the continuous body of the base material, the continuous body of the metal sheet constituting the antenna pattern; a cutting step of forming a shape cutting of the antenna pattern into the continuous body of the metal sheet; a removing step of removing an unnecessary part not constituting the antenna pattern in the continuous body of the metal sheet; a pressurizing step of pressurizing the antenna pattern arranged on the continuous body of the base material; and an IC chip mounting step of fixing the IC chip to a specific position at the antenna pattern using a conductive material.

According to another aspect of the present invention, there is provided a method for manufacturing RFID label stuck to an adhered body. The RFID label includes a base material having a printed surface, an antenna pattern disposed on a surface opposite to the printed surface of the base material, and an IC chip coupled to the antenna pattern. The method includes: an adhesive arranging step of arranging an adhesive for antenna pattern inside with respect to a perimeter line of the antenna pattern while conveying a continuous body of the base material, the antenna pattern being arranged on a surface opposite to the printed surface of the base material; a metal sheet arranging step of arranging a continuous body of a metal sheet on a surface on which the adhesive for antenna pattern is arranged of the continuous body of the base material, the continuous body of the metal sheet constituting the antenna pattern; a cutting step of forming a shape cutting of the antenna pattern into the continuous body of the metal sheet; a removing step of removing an unnecessary part not constituting the antenna pattern in the continuous body of the metal sheet; a pressurizing step of pressurizing the antenna pattern arranged on the continuous body of the base material; an IC chip mounting step of fixing the IC chip to a specific position at the antenna pattern using a conductive material; and a step of arranging a separator on the surface on which the antenna pattern is formed at the base material via an adhesive for adhered body.

Furthermore, according to another aspect of the present invention, there is provided a method for manufacturing RFID label stuck to an adhered body. The RFID label includes a base material, an antenna pattern disposed at one surface of the base material, and an IC chip coupled to the antenna pattern. The method includes: an adhesive arranging step of arranging an adhesive for antenna pattern inside with respect to a perimeter line of the antenna pattern arranged on a continuous body of the base material while conveying the continuous body of the base material; a metal sheet arranging step of arranging a continuous body of a metal sheet on a surface on which the adhesive for antenna pattern is arranged of the continuous body of the base material, the continuous body of the metal sheet constituting the antenna pattern; a cutting step of forming a shape cutting of the antenna pattern into the continuous body of the metal sheet; a removing step of removing an unnecessary part not constituting the antenna pattern in the continuous body of the metal sheet; a pressurizing step of pressurizing the antenna pattern arranged on the continuous body of the base material; an IC chip mounting step of fixing the IC chip to a specific position at the antenna pattern using a conductive material; a step of arranging a separator on a surface on which the antenna pattern is formed at the base material via an adhesive for adhered body; and a step of arranging an external base material having a printed surface on a surface opposite to the surface on which the separator is arranged of the base material with the printed surface facing an outside via an adhesive for external base material or a bonding agent for external base material.

Furthermore, according to another aspect of the present invention, there is provided a method for manufacturing RFID label stuck to an adhered body. The RFID label includes a base material, an antenna pattern disposed at one surface of the base material, and an IC chip coupled to the antenna pattern. The method includes: an adhesive arranging step of arranging an adhesive for antenna pattern inside with respect to a perimeter line of the antenna pattern arranged on a continuous body of the base material while conveying the continuous body of the base material; a metal sheet arranging step of arranging a continuous body of a metal sheet on a surface on which the adhesive for antenna pattern is arranged of the continuous body of the base material, the continuous body of the metal sheet constituting the antenna pattern; a cutting step of forming a shape cutting of the antenna pattern into the continuous body of the metal sheet; a removing step of removing an unnecessary part not constituting the antenna pattern in the continuous body of the metal sheet; a pressurizing step of pressurizing the antenna pattern arranged on the continuous body of the base material; an IC chip mounting step of fixing the IC chip to a specific position at the antenna pattern using a conductive material; a step of arranging an external base material on the surface on which the antenna pattern is formed at the base material via an adhesive for adhered body or a bonding agent for adhered body; and a step of arranging a separator on a surface opposite to the surface on which the antenna pattern is formed at the base material via an adhesive.

Furthermore, according to another aspect of the present invention, there is provided a method for manufacturing RFID medium that includes a base material, an antenna pattern disposed at one surface of the base material, and an IC chip coupled to the antenna pattern. The method includes: an adhesive arranging step of arranging an adhesive for antenna pattern inside with respect to a perimeter line of the antenna pattern arranged on a continuous body of the base material while conveying the continuous body of the base material; a metal sheet arranging step of arranging a continuous body of a metal sheet on a surface on which the adhesive for antenna pattern is arranged of the continuous body of the base material, the continuous body of the metal sheet constituting the antenna pattern; a cutting step of forming a shape cutting of the antenna pattern into the continuous body of the metal sheet; a removing step of removing an unnecessary part not constituting the antenna pattern in the continuous body of the metal sheet; a pressurizing step of pressurizing the antenna pattern arranged on the continuous body of the base material; an IC chip mounting step of fixing the IC chip to a specific position at the antenna pattern using a conductive material; a step of arranging a first external base material on the surface on which the antenna pattern is formed at the base material via an adhesive for external base material or a bonding agent for external base material; and a step of arranging a second external base material on a surface opposite to the surface on which the first external base material is arranged of the base material via the adhesive for external base material or the bonding agent for external base material.

According to these aspects, the antenna patterns can be manufactured with good productivity by the method other than the etching method.

DESCRIPTION OF EMBODIMENTS

[RFID Inlet]

Figure 1:
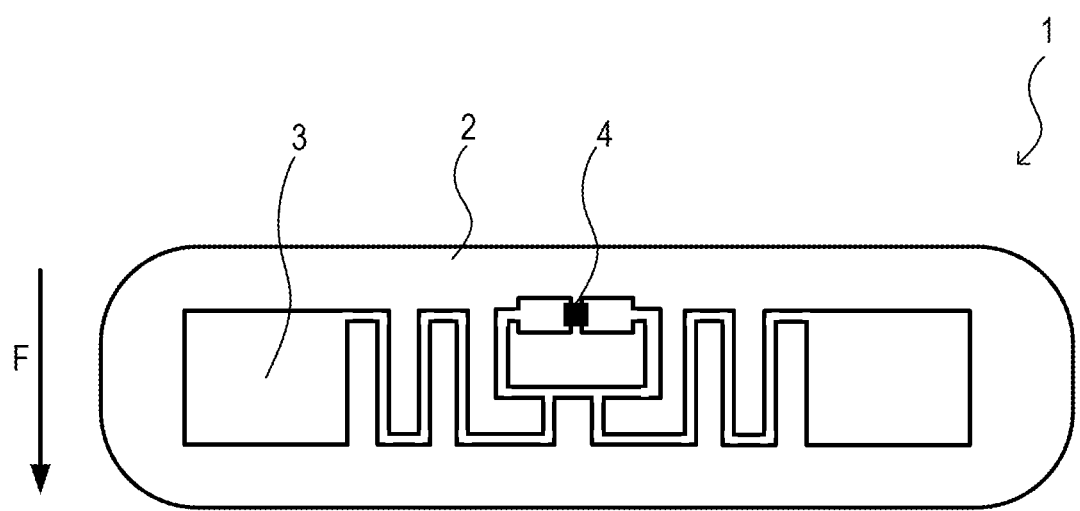
FIG. 1 is an external view describing an RFID inlet 1 manufactured using a method for manufacturing antenna pattern according to an embodiment of the present invention.

The following describes an RFID inlet 1 manufactured using a method for manufacturing antenna pattern prior to an explanation of a method for manufacturing this antenna pattern according to this embodiment. FIG. 1 is an external view describing the RFID inlet 1 manufactured using the method for manufacturing antenna pattern according to the embodiment. The arrow F described in FIG. 1 matches a conveyance direction in a manufacturing apparatus 100 described later.

As illustrated in FIG. 1, the RFID inlet 1 includes a base material 2, an antenna pattern 3 disposed on one surface of the base material 2, and an IC chip 4 with a Radio Frequency Identification (RFID) specification coupled to the antenna pattern 3. Performing a predetermined process on the RFID inlet 1 allows forming an RFID medium such as a tag, a label, and a wristband.

According to the specification of the RFID, the antenna pattern 3 is designed to be a pattern corresponding to a specific frequency band such as an UHF band (300 MHz to 3 GHz, especially 860 MHz to 960 MHz), a microwave (1 to 30 GHz, especially near 2.4 GHz), and a HF band (3 MHz to 30 MHz, especially near 13.56 MHz). This embodiment describes the case where the antenna pattern 3 is the pattern accommodating the UHF band.

[Method for Manufacturing Antenna Pattern]

Figure 2:
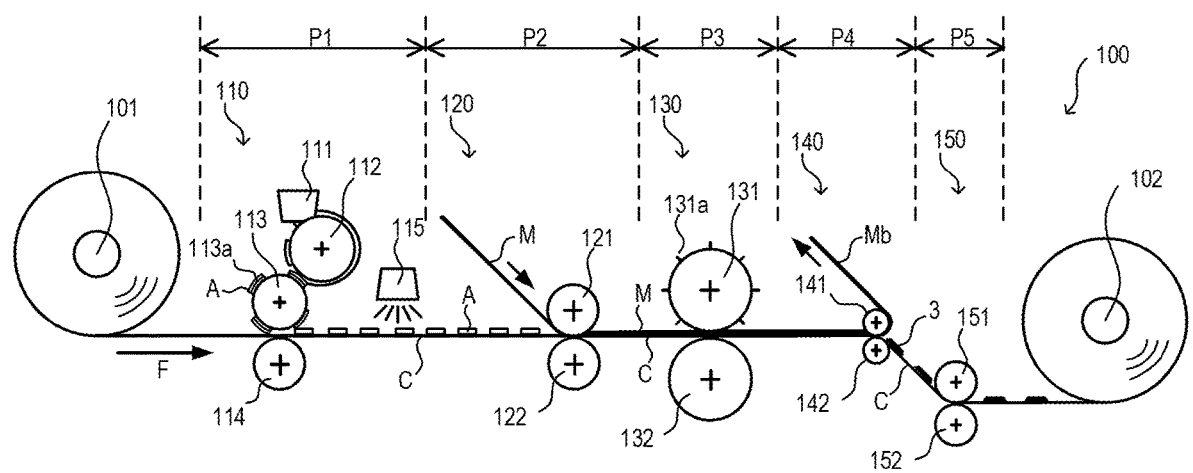
FIG. 2 is a schematic diagram of a manufacturing apparatus 100 that performs the method for manufacturing antenna pattern according to the embodiment of the present invention.

The following describes the method for manufacturing antenna pattern according to the embodiment of the present invention with reference to the drawing. FIG. 2 is a schematic diagram of the manufacturing apparatus 100 that performs the method for manufacturing antenna pattern according to the embodiment.

As illustrated in FIG. 2, the method for manufacturing antenna pattern according to the embodiment includes an adhesive arranging step P1, a metal sheet arranging step P2, a cutting step P3, a removing step P4, and a pressurizing step P5. The adhesive arranging step P1 arranges adhesives A on a continuous body C while conveying the continuous body C of the base material 2. The metal sheet arranging step P2 arranges a continuous body M of a metal sheet on a surface on which the adhesives A are arranged on the continuous body C. The cutting step P3 forms a shape cutting of the antenna patterns 3 into the continuous body M of the metal sheet. The removing step P4 removes an unnecessary part Mb, which does not constitute the antenna patterns 3, in the continuous body M of the metal sheet. The pressurizing step P5 pressurizes the antenna patterns 3 remaining on the continuous body C. The arrow F in FIG. 2 indicates the conveyance direction.

The adhesive arranging step P1 is performed by an adhesive arranging unit 110. The adhesive arranging unit 110 includes an adhesive tank 111, which accumulates adhesive, a pump roller 112, which pumps up the adhesive from the adhesive tank 111, a plate roller 113, which receives the adhesive A from the pump roller 112 and prints the adhesive A on the continuous body C, and an impression cylinder 114. Additionally, the adhesive arranging unit 110 includes a UV lamp 115 that irradiates the adhesive A with ultraviolet light.

A plate on which convex patterns 113a, which correspond to the shape of the adhesives A arranged on the continuous body C of the base material 2, are formed is wound around a plate cylinder of the plate roller 113. The plate roller 113 includes the plurality of convex patterns 113a. The plurality of convex patterns 113a are imposed and aligned in a feeding direction and a width direction of the plate roller 113. Thus, the adhesives for the plurality of antenna patterns can be printed on the continuous body C simultaneously. The convex patterns 113a each has the shape falling within an inside with respect to a perimeter line of the antenna pattern 3 arranged on the base material 2.

The adhesives A arranged on the continuous body C preferably have a thickness of 3 µm or more to 25 µm or less. The thickness of 3 µm or more ensures obtaining sufficient adhesive force to stick the antenna patterns 3. The thickness of 25 µm or less does not overflow the adhesive A to the outside with respect to the perimeter line of the antenna pattern 3 by pressurization. From this aspect, the adhesive A more preferably has the thickness of 3 µm or more to 10 µm or less.

Figure 3:
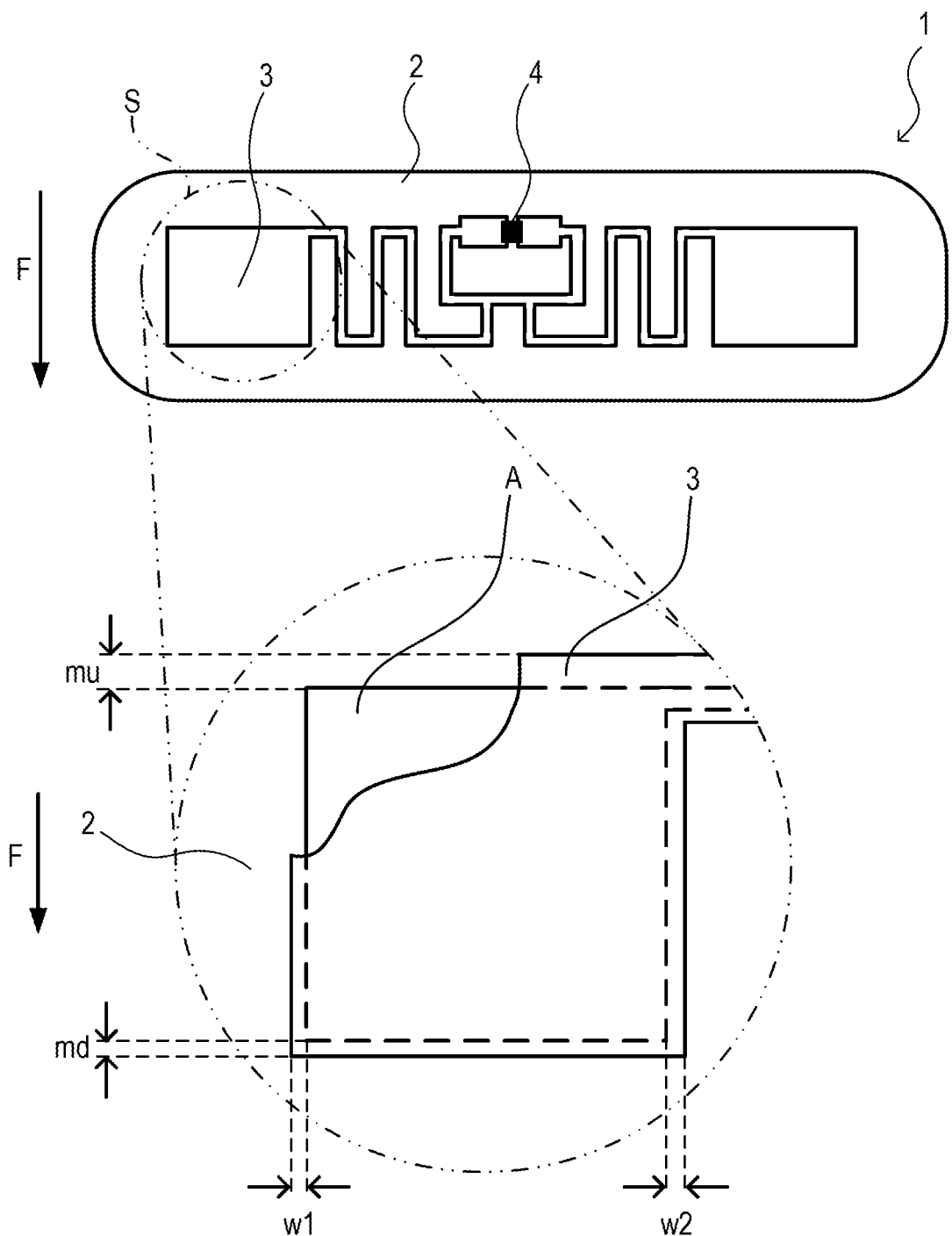
FIG. 3 is a partially enlarged view illustrating a partially cut-out enlarged main part of the RFID inlet 1.

FIG. 3 is a partially enlarged view illustrating a partially cut-out enlarged main part of the RFID inlet 1. FIG. 3 indicates a part of the adhesive A positioned below the antenna pattern 3 by the dashed line in the enlarged part of the RFID inlet 1. FIG. 3 illustrates margins between the perimeter line of the antenna pattern 3 and the adhesive A arranged inside the perimeter line of the antenna pattern 3 by mu, md, w1, and w2.

The arranged position of the adhesive A is positioned such that the margin mu on the upstream side in the conveyance direction becomes wider than the margin md on the downstream side in the conveyance direction. That is, the margin mu illustrated in FIG. 3 is larger than the margin md.

An excessively large margin possibly floats an edge portion of the antenna pattern 3 or peels off the antenna pattern 3. Additionally, an excessively narrow margin possibly overflows the adhesive A from the outer peripheral portion of the antenna pattern 3. From these aspects, the margin mu is preferably 50 µm or more to 300 µm or less and the margin md is preferably 30 µm or more to 100 µm or less (Note that mu>md is met).

It should be noted that, while not illustrated in FIG. 1, prior to the adhesive arranging step P1, a step of printing a reference mark is performed. The reference mark can serve as a reference for positioning when the adhesive is printed to the continuous body C and positioning of a cutting position when the shape cutting of the antenna pattern is formed.

A material applicable as the base material 2 (the same applies to the continuous body C described later) of this embodiment includes paper such as high-quality paper and coated paper, a resin film such as polyvinyl chloride, polyethylene terephthalate, polypropylene, polyethylene, and polyethylene naphthalate alone, and a multilayer film formed by laminating a plurality of these resin films.

The base material 2 preferably has the thickness of 25 µm or more to 300 µm or less. The use of the paper as the base material allows configuring the thickness to be 50 µm or more to 260 µm or less in the above-described range and the thickness is usually preferably 80 µm. Additionally, the use of the resin film as the base material allows configuring the thickness to be 25 µm or more to 200 µm or less in the above-described range. The thickness can be appropriately selectable among these thicknesses according to the application.

The adhesive A applicable to the adhesive arranging step P1 includes acrylic-based adhesive, urethane-based adhesive, silicone-based adhesive, rubber-based adhesive, and similar adhesive. From the aspect that this embodiment arranges the adhesives A on the conveyed continuous body C by flexography and letterpress printing, acrylic-based adhesive of ultraviolet curing type is preferably used. Besides, screen-printing is applicable.

The adhesive force of the adhesive A is preferably 500 gf/25 mm or more in the 180 degree peel test (JIS Z 0237), more preferably 800 gf/25 mm or more, and further preferably 1000 gf/25 mm or more. The upper limit value of the adhesive force is preferably 2000 gf/25 mm.

The metal sheet arranging step P2 is performed by a metal sheet arranging unit 120. The metal sheet arranging unit 120 includes a pressing roller 121 and a supporting roller 122. The metal sheet arranging step P2 stacks the continuous body M of the metal sheet conveyed by a conveyance path different from a conveyance path of the continuous body C on a surface on which the adhesives A are arranged of the continuous body C and inserts the stacked continuous body M and continuous body C between the pressing roller 121 and the supporting roller 122 to stick the continuous body M and the continuous body C together. Since the adhesives are absent at the outside with respect to the perimeter lines of the antenna patterns 3, the continuous body M of the metal sheet is not stuck to the continuous body C except for regions where the antenna patterns 3 are formed.

As long as conductive metal usually used for the formation of the antenna patterns, the metal is applicable as metal constituting the metal sheet. One example of the metal includes copper and aluminum. From the aspect of reducing the production cost, aluminum is preferably used. From the aspects of the entire thickness of the RFID inlet 1, the entire thickness of the RFID inlet 1 when formed on the RFID medium, and the production cost, the metal sheet preferably has the thickness of 3 µm or more to 25 µm or less. This embodiment uses an aluminum sheet with the thickness of 20 µm.

The cutting step P3 is performed by a cutting unit 130. The cutting unit 130 includes a die roll 131, which forms the shape cutting of the antenna patterns 3 into the continuous body M of the metal sheet arranged on the continuous body C, and an anvil roller 132, which backs up the die roll 131. Convex cutting portions 131a having the shapes of the perimeter lines of the antenna patterns 3 are formed on the surface of the die roll 131. The convex cutting portion 131a can be configured as a flexible die. In addition to this, the convex cutting portion 131a can include a chisel, an embedded blade, and the like.

The cutting unit 130 continuously conveys a sandwiched workpiece formed of the continuous body C and the continuous body M and causes the convex cutting portions 131a to bite into the continuous body M of the metal sheet to partition the antenna patterns 3. This allows forming the shape cutting of the antenna patterns 3 into the continuous body M of the metal sheet.

The removing step P4 is performed by a removal unit 140. The removal unit 140 includes peeling rollers 141 and 142. The unnecessary part Mb of the metal sheet is caused to run along a part of the peeling roller 141 to change the conveyance direction, and the workpiece is caused to run along a part of the peeling roller 142 to convey the workpiece to a direction different from the conveyance direction of the unnecessary part Mb, thus pulling the unnecessary part Mb of the metal sheet apart from the workpiece formed of the continuous body C and the continuous body M. After the recovery, a reproduction process treatment is performed on the unnecessary part Mb to utilize the unnecessary part Mb as the continuous body M of the metal sheet again.

The pressurizing step P5 is performed by a pressurizing unit 150. The pressurizing unit 150 includes a pressing roller 151 and a supporting roller 152. The pressurizing unit 150 pressurizes the workpiece sandwiched between the pressing roller 151 and the supporting roller 152 to press and spread the adhesives A over all of the surfaces of the antenna patterns 3 arranged on the continuous body C. The pressure is preferably 2 kg/cm or more to 6 kg/cm or less.

After the pressurizing step P5, the workpiece where the antenna patterns 3 are arranged on the continuous body C of the base material 2 is rolled up by a rolling-up roller 102.

Next, the following describes behaviors of the manufacturing apparatus 100, which performs the above-described method for manufacturing antenna pattern and operational advantages brought by the behaviors.

With the manufacturing apparatus 100, which performs the above-described method for manufacturing antenna pattern, the continuous body C of the base material 2 fed from a feeding roller 101 passes through between the plate roller 113 and the impression cylinder 114 at the adhesive arranging step P1. Thus, the adhesives A are arranged on regions where the antenna patterns 3 are expected to be arranged and regions inside with respect to the perimeter lines of the antenna patterns 3.

Next, at the metal sheet arranging step P2, the continuous body M of the metal sheet is stacked on the continuous body C on which the adhesives A are arranged.

Subsequently, at the cutting step P3, the shape cutting of the antenna patterns 3 are formed on the workpiece formed of the continuous body C and the continuous body M of the metal sheet by the die roll 131 on which the convex cutting portions 131a having the shape of the perimeter lines of the antenna patterns 3 are formed.

Next, at the removing step P4, the unnecessary part Mb, which does not constitute the antenna patterns 3 in the continuous body M of the metal sheet, is removed.

Subsequently, at the pressurizing step P5, the antenna patterns 3 arranged on the continuous body C are pressurized.

By the above-described steps, the antenna patterns 3 can be formed on the continuous body C of the base material 2.

With the method for manufacturing antenna pattern according to the embodiment, at the pressurizing step P5, the pressurizing unit 150 pressurizes the workpiece sandwiched between the pressing roller 151 and the supporting roller 152 to press and spread the adhesives A over all of the surfaces of the antenna patterns 3 arranged on the continuous body C. The pressurization ensures obtaining adhesion of the adhesives A, thereby ensuring close contact of the antenna patterns 3 with the continuous body C.

At the pressurizing step P5, by pressuring the workpiece on which the antenna patterns 3 are arranged on the continuous body C by the pressing roller 151 and the supporting roller 152 while conveying the workpiece, the adhesives A arranged between the continuous body C and the antenna patterns 3 are drawn out to the upstream side in the conveyance direction. In contrast to this, with the method for manufacturing antenna pattern according to the embodiment, regarding the margins between the perimeter lines of the antenna patterns 3 and the adhesives A arranged inside the perimeter lines of the antenna patterns 3, the position of the adhesive A is arranged such that the margin on the upstream side in the conveyance direction becomes wider than the margin on the downstream side in the conveyance direction; therefore, the adhesive A drawn out to the upstream side in the conveyance direction falls within the margin mf, which is configured wide on the upstream side in the conveyance direction.

With the method for manufacturing antenna pattern according to the embodiment, since the adhesive A does not attach to the unnecessary part Mb of the metal sheet, when the unnecessary part Mb is rolled up, a stripping force that strips the unnecessary part Mb from the workpiece needs not to be added to a rolling-up roller (not illustrated in FIG. 2) for the unnecessary part Mb. Accordingly, a conveyance speed of the workpiece is settable without considering the stripping force of the unnecessary part Mb of the metal sheet, a fracture caused by this stripping force, and the like. Additionally, the adhesive A does not attach to the unnecessary part Mb of the metal sheet or an attachment of another foreign matter caused by the attachment of the adhesive A does not occur, thereby being advantageous in good handleability after the recovery and excellent reusability of the metal sheet.

[Modifications]

Next, the following describes the modifications of the method for manufacturing antenna pattern according to the embodiment.

With the method for manufacturing antenna pattern according to the embodiment, the base material 2 may be a thermal paper. With the method for manufacturing antenna pattern according to the embodiment, to enhance adhesiveness of the adhesive to the continuous body C of the base material 2, an undercoat layer may be arranged on the continuous body C of the base material 2 at a step prior to the adhesive arranging step P1.

With the method for manufacturing antenna pattern according to the embodiment, at the removing step P4, a suction mechanism that removes the unnecessary part Mb by suction may be disposed, in addition the peeling rollers 141 and 142, which pull the unnecessary part Mb of the metal sheet apart from the workpiece. This allows reliably removing pieces of the metal sheet, which are likely to remain on the workpiece only by the separation with the peeling rollers 141 and 142.

In the method for manufacturing antenna pattern according to the embodiment, it has been described that the antenna patterns 3 are the antenna patterns applied to the UHF band. However, the antenna patterns are not limited to the application to the UHF band. Coil-shaped HF band antennas and antennas handling other frequency bandwidths can also be manufactured.

[Method for Manufacturing RFID Inlet]

Next, the following describes the method for manufacturing RFID inlet according to the embodiment of the present invention. The method for manufacturing RFID inlet according to the embodiment includes a mounting step that mounts the IC chip 4 to the workpiece manufactured by the above-described method for manufacturing antenna pattern.

The mounting step fixes the IC chip 4 to a specific position at the antenna pattern 3 using a conductive material. As one example of a bonding method of the IC chip 4, bonding by baking using an anisotropic conductive paste or a conductive film is usable.

[Method for Manufacturing RFID Label (1)]

Next, the following describes the method for manufacturing RFID label according to the embodiment of the present invention. The method for manufacturing RFID label according to the embodiment is a method for manufacturing RFID label stuck to the adhered body. The RFID label includes the base material 2 having a printed surface, the antenna pattern 3 disposed on a surface opposite to the printed surface of the base material 2, and the IC chip 4 coupled to the antenna pattern 3.

The method for manufacturing RFID label according to the embodiment uses the base material 2 having the one surface on which the printed surface is formed as the above-described base material 2 of the RFID inlet.

The method for manufacturing RFID label according to the embodiment includes: an adhesive arranging step P1 of arranging an adhesive for antenna pattern A inside with respect to a perimeter line of the antenna pattern 3 while conveying a continuous body C of the base material, the antenna pattern being arranged on a surface opposite to the printed surface of the base material 2; a metal sheet arranging step P2 of arranging a continuous body M of a metal sheet on a surface on which the adhesive for antenna pattern A is arranged of the continuous body C of the base material, the continuous body M of the metal sheet constituting the antenna pattern 3; a cutting step P3 of forming a shape cutting of the antenna pattern 3 into the continuous body M of the metal sheet; a removing step P4 of removing an unnecessary part Mb not constituting the antenna pattern 3 in the continuous body M of the metal sheet; a pressurizing step P5 of pressurizing the antenna pattern 3 arranged on the continuous body C of the base material; an IC chip mounting step of fixing the IC chip 4 to a specific position at the antenna pattern 3 using a conductive material; and a step of arranging a separator on the surface on which the antenna pattern 3 is formed at the base material via an adhesive for adhered body.

[Method for Manufacturing RFID Label (2)]

Next, the following describes the method for manufacturing RFID label according to another embodiment of the present invention.

The method for manufacturing RFID label according to another embodiment of the present invention is a method for manufacturing RFID label stuck to an adhered body. The RFID label includes a base material 2, an antenna pattern 3 disposed at one surface of the base material 2, and an IC chip 4 coupled to the antenna pattern 3. The method includes: an adhesive arranging step P1 of arranging an adhesive for antenna pattern A inside with respect to a perimeter line of the antenna pattern 3 arranged on a continuous body C of the base material while conveying the continuous body C of the base material; a metal sheet arranging step P2 of arranging a continuous body M of a metal sheet on a surface on which the adhesive for antenna pattern A is arranged of the continuous body C of the base material, the continuous body M of the metal sheet constituting the antenna pattern 3; a cutting step P3 of forming a shape cutting of the antenna pattern 3 into the continuous body M of the metal sheet; a removing step P4 of removing an unnecessary part Mb not constituting the antenna pattern 3 in the continuous body M of the metal sheet; a pressurizing step P5 of pressurizing the antenna pattern 3 arranged on the continuous body C of the base material 2; an IC chip mounting step of fixing the IC chip 4 to a specific position at the antenna pattern 3 using a conductive material; a step of arranging a separator on a surface on which the antenna pattern 3 is formed at the base material 2 via an adhesive for adhered body; and a step of arranging an external base material having a printed surface on a surface opposite to the surface on which the separator is arranged of the base material with the printed surface facing an outside via an adhesive for external base material or a bonding agent for external base material.

In this embodiment, the external base material having the printed surface protects the antenna pattern 3 and the IC chip 4 arranged on the base material 2 and determines the configuration of the label. A thickness and a material are selectable according to a desired application.

After the IC chip mounting step, another method may include: a step of arranging an external base material on the surface on which the antenna pattern 3 is formed at the base material 2 via an adhesive for adhered body or a bonding agent for adhered body; and a step of arranging a separator on a surface opposite to the surface on which the antenna pattern 3 is formed at the base material 2 via an adhesive.

In this case, the surface on which the antenna pattern 3 is formed at the base material 2 is set as the adhered body side and the surface can be stuck to the adhered body. It should be noted that, the step of arranging the separators on the surfaces opposite to the surfaces on which the antenna patterns 3 are formed of the base materials 2 via the adhesive may be eliminated.

The method for manufacturing RFID label according to the embodiment can use emulsion-based bonding agent, solvent-based bonding agent, and hotmelt-based bonding agent as the bonding agent to stick the external base material to the RFID inlet 1. Additionally, the adhesive is usable. As the bonding agent, acrylic-based bonding agent, urethane-based bonding agent, silicone-based bonding agent, rubber-based bonding agent, and the like are applicable. As the adhesive, acrylic-based adhesive, urethane-based adhesive, silicone-based adhesive, rubber-based adhesive, and the like are applicable.

[Method for Manufacturing RFID Medium]

Next, the following describes the method for manufacturing RFID medium according to another embodiment of the present invention.

The method for manufacturing RFID medium according to another embodiment of the present invention is a method for manufacturing RFID medium that includes a base material 2, an antenna pattern 3 disposed at the one surface of the base material 2, and an IC chip 4 coupled to the antenna pattern 3. The method includes: an adhesive arranging step P1 of arranging an adhesive for antenna pattern A inside with respect to a perimeter line of the antenna pattern 3 arranged on a continuous body C of the base material while conveying the continuous body C of the base material; a metal sheet arranging step P2 of arranging a continuous body M of a metal sheet on a surface on which the adhesive for antenna pattern A is arranged of the continuous body C of the base material, the continuous body M of the metal sheet constituting the antenna pattern 3; a cutting step P3 of forming a shape cutting of the antenna pattern 3 into the continuous body M of the metal sheet; a removing step P4 of removing an unnecessary part Mb not constituting the antenna pattern 3 in the continuous body M of the metal sheet; a pressurizing step P5 of pressurizing the antenna pattern 3 arranged on the continuous body C of the base material; an IC chip mounting step of fixing the IC chip 4 to a specific position at the antenna pattern 3 using a conductive material; a step of arranging a first external base material on the surface on which the antenna pattern is formed at the base material via an adhesive for external base material or a bonding agent for external base material; and a step of arranging a second external base material on a surface opposite to the surface on which the first external base material is arranged of the base material via the adhesive for external base material or the bonding agent for external base material.

With this embodiment, the first external base material and the second external base material protect the antenna pattern 3 and the IC chip 4 arranged on the base material 2 and fix the configurations of the tag (especially an apparel tag), the label, the wristband, a ticket, and the like. A thickness and a material are selectable according to a desired application.

The method for manufacturing RFID medium according to the embodiment can use emulsion-based bonding agent, solvent-based bonding agent, and hotmelt-based bonding agent as the bonding agent to stick the first and the second external base materials to the RFID inlet 1. Additionally, the adhesive is usable. As the bonding agent, acrylic-based bonding agent, urethane-based bonding agent, silicone-based bonding agent, rubber-based bonding agent, and the like are applicable. As the adhesive, acrylic-based adhesive, urethane-based adhesive, silicone-based adhesive, rubber-based adhesive, and the like are applicable.

The embodiments of the present invention described above are merely illustration of some application examples of the present invention and not of the nature to limit the technical scope of the present invention to the specific constructions of the above embodiments.

This application is based on and claims priority to Japanese Patent Application No. 2016-056201 filed in Japan Patent Office on Mar. 18, 2016, the entire content of which is incorporated herein by reference.

The invention claimed is:

1. A method of manufacturing an antenna pattern for an RFID inlet that includes a base material, the antenna pattern disposed at one surface of the base material, and an IC chip coupled to the antenna pattern, the method comprising:
    an adhesive arranging step of arranging an adhesive on a surface of a continuous body of the base material inside an intended perimeter line of the antenna pattern to be arranged on the continuous body of the base material;
    a metal sheet arranging step of arranging a continuous body of a metal sheet on the surface of the continuous body of the base material on which the adhesive is arranged;
    a cutting step of forming a shape cutting of the antenna pattern into the continuous body of the metal sheet;
    a removing step of removing an unnecessary part of the continuous body of the metal sheet not including the antenna pattern; and
    a pressurizing step of pressurizing the antenna pattern arranged on the continuous body of the base material while conveying the continuous body of the base material, wherein,
    in the adhesive arranging step, the adhesive is positioned in an arranged position such that margins are formed around an entire perimeter of the adhesive between the intended perimeter line of the antenna pattern and the adhesive, the margins including
        a downstream margin formed between the intended perimeter line of the antenna pattern and the adhesive on a downstream side of the continuous body of the base material in a conveyance direction, and
        an upstream margin wider than the downstream margin and formed between the adhesive and the intended perimeter line of the antenna pattern on an upstream side of the continuous body of the base material in the conveyance direction, and
    in the pressurizing step, the adhesive is spread toward the upstream side within the upstream margin.

2. The method of manufacturing an antenna pattern according to claim 1, wherein
    in the adhesive arranging step, the adhesive is printed to the continuous body of the base material by a letterpress, the letterpress having a convex pattern corresponding to a shape of the adhesive arranged on the continuous body of the base material.

3. The method of manufacturing an antenna pattern according to claim 1, wherein
    in the removing step, the unnecessary part is removed by a suction.

4. The method of manufacturing an antenna pattern according to claim 1, wherein
    in the pressurizing step, the adhesive is spread toward the upstream side by sandwiching and pressurizing the continuous body of the base material on which the antenna pattern is formed between a pressing roller and a supporting roller while conveying.

5. The method of manufacturing an antenna pattern according to claim 1, wherein
    the base material is a thermal paper, and
    the adhesive is an ultraviolet curing adhesive.

* * * * *